(12) United States Patent
Sakamoto et al.

(10) Patent No.: US 9,706,663 B2
(45) Date of Patent: Jul. 11, 2017

(54) PRINTED WIRING BOARD, METHOD FOR MANUFACTURING THE SAME AND SEMICONDUCTOR DEVICE

(71) Applicant: IBIDEN CO., LTD., Ogaki (JP)

(72) Inventors: Hajime Sakamoto, Ogaki (JP);
Masatoshi Kunieda, Ogaki (JP);
Makoto Terui, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 42 days.

(21) Appl. No.: 14/840,693

(22) Filed: Aug. 31, 2015

(65) Prior Publication Data

US 2016/0066422 A1    Mar. 3, 2016

(30) Foreign Application Priority Data

Sep. 1, 2014 (JP) .................................. 2014-177019

(51) Int. Cl.
| | |
|---|---|
| *H01L 23/538* | (2006.01) |
| *H05K 1/18* | (2006.01) |
| *H05K 1/14* | (2006.01) |

(52) U.S. Cl.
CPC ......... *H05K 1/181* (2013.01); *H01L 23/5385* (2013.01); *H01L 23/5383* (2013.01); *H01L 23/5384* (2013.01); *H01L 2224/1403* (2013.01); *H01L 2224/16238* (2013.01); *H01L 2924/15192* (2013.01); *H01L 2924/15313* (2013.01);
(Continued)

(58) Field of Classification Search
CPC ........... H05K 1/181; H05K 2201/1053; H05K 1/141; H05K 2201/106974; H05K 2201/10522; H01L 23/5385; H01L 23/5384; H01L 2224/16238; H01L 2224/1403; H01L 2924/15313; H01L 2924/15192; H01L 23/5383; Y02P 70/611
See application file for complete search history.

(56) References Cited

U.S. PATENT DOCUMENTS

| | | | |
|---|---|---|---|
| 6,411,519 B2 * | 6/2002 | Asai .................. | H01L 23/49816 174/255 |
| 6,724,638 B1 * | 4/2004 | Inagaki ............... | H01L 21/4857 257/E23.062 |

(Continued)

FOREIGN PATENT DOCUMENTS

JP       2014-049578 A      3/2014

*Primary Examiner* — Adam B Dravininkas
(74) *Attorney, Agent, or Firm* — Oblon, McClelland, Maier & Neustadt, L.L.P.

(57) ABSTRACT

A printed wiring board includes a first resin insulating layer, a first conductor pattern including first mounting pads formed on the first resin insulating layer, and a wiring structure positioned on the first resin insulating layer and including a second resin insulating layer and a second conductor pattern such that the second resin insulating layer and second conductor pattern are positioned adjacent to the first conductor pattern and that the second conductor pattern includes second mounting pads. The second mounting pads are embedded in the second resin insulating layer such that the second mounting pads have mounting surfaces exposed on an exposed surface of the second resin insulating layer, and the first mounting pads have mounting surfaces such that the mounting surfaces of the first and second mounting pads are formed on a same plane.

18 Claims, 20 Drawing Sheets

(52) U.S. Cl.
CPC ..... *H05K 1/141* (2013.01); *H05K 2201/1053* (2013.01); *H05K 2201/10522* (2013.01); *H05K 2201/10674* (2013.01); *Y02P 70/611* (2015.11)

(56) References Cited

U.S. PATENT DOCUMENTS

| | | | |
|---|---|---|---|
| 6,930,258 B1* | 8/2005 | Kawasaki | H01L 23/49811 174/255 |
| 2006/0163740 A1* | 7/2006 | Ohno | H01L 23/49816 257/762 |
| 2007/0281394 A1* | 12/2007 | Kawabe | H01L 21/4857 438/118 |
| 2008/0053693 A1* | 3/2008 | Wu | H05K 1/115 174/265 |
| 2012/0227261 A1* | 9/2012 | Inui | H05K 1/186 29/849 |
| 2013/0048355 A1* | 2/2013 | Furuta | H05K 3/4602 174/257 |
| 2013/0240258 A1* | 9/2013 | Ishida | H05K 1/0306 174/258 |
| 2013/0258625 A1* | 10/2013 | Terui | H05K 1/115 361/774 |
| 2014/0102768 A1* | 4/2014 | Shizuno | H01L 24/14 174/251 |
| 2014/0247561 A1* | 9/2014 | Inui | H05K 1/186 361/707 |

* cited by examiner

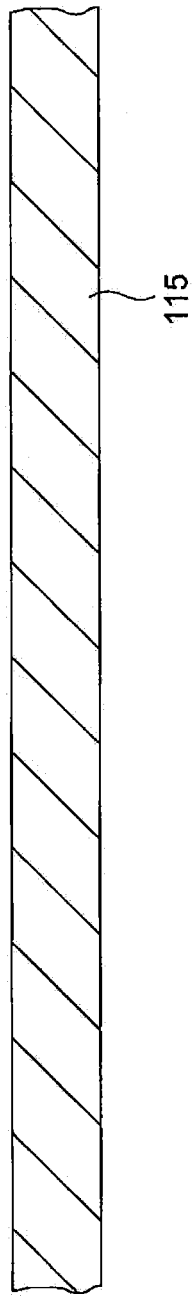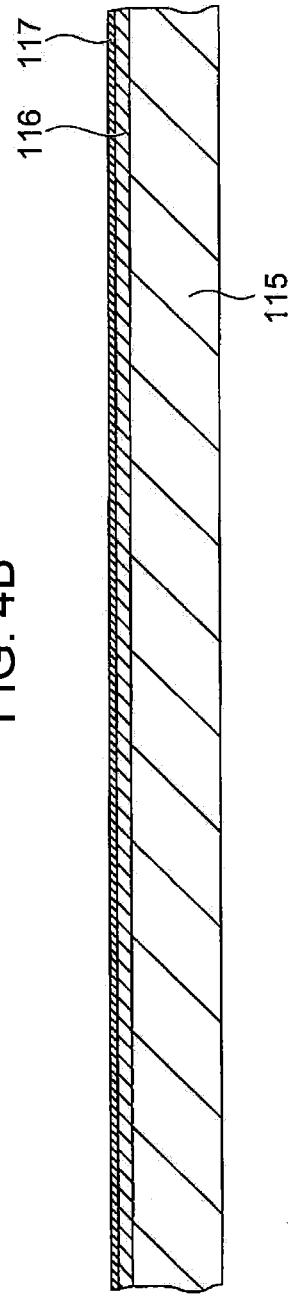

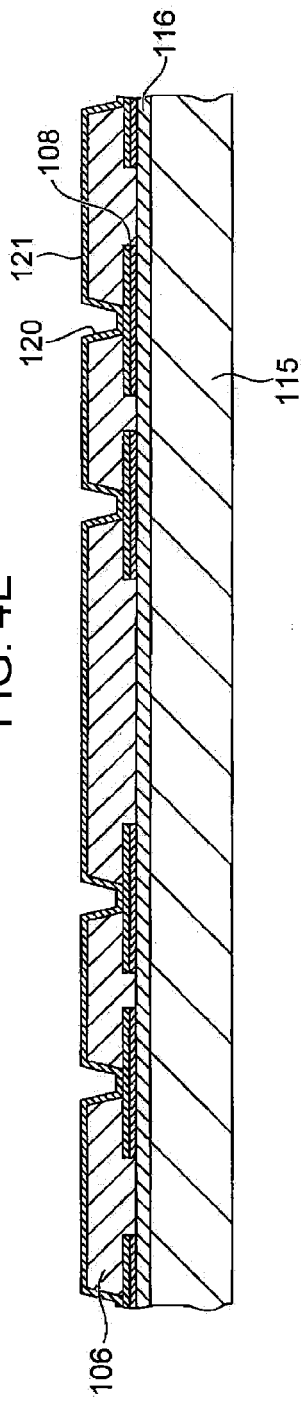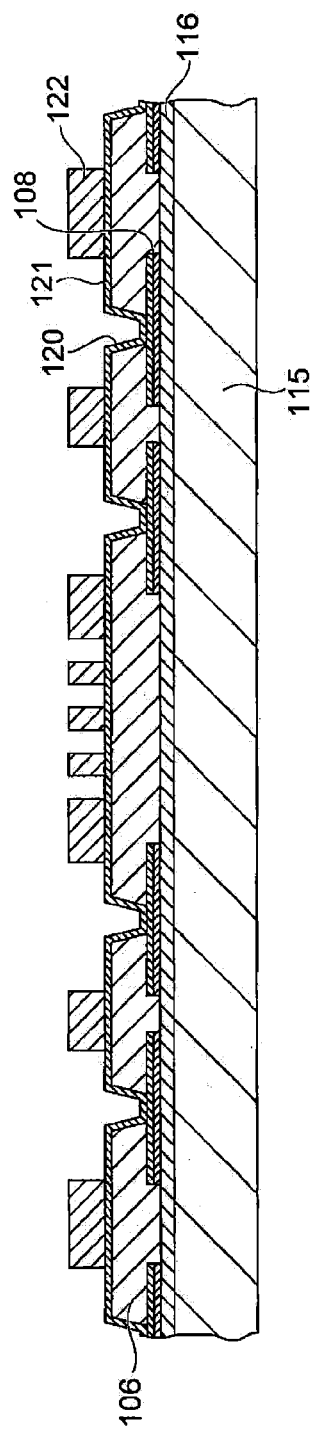

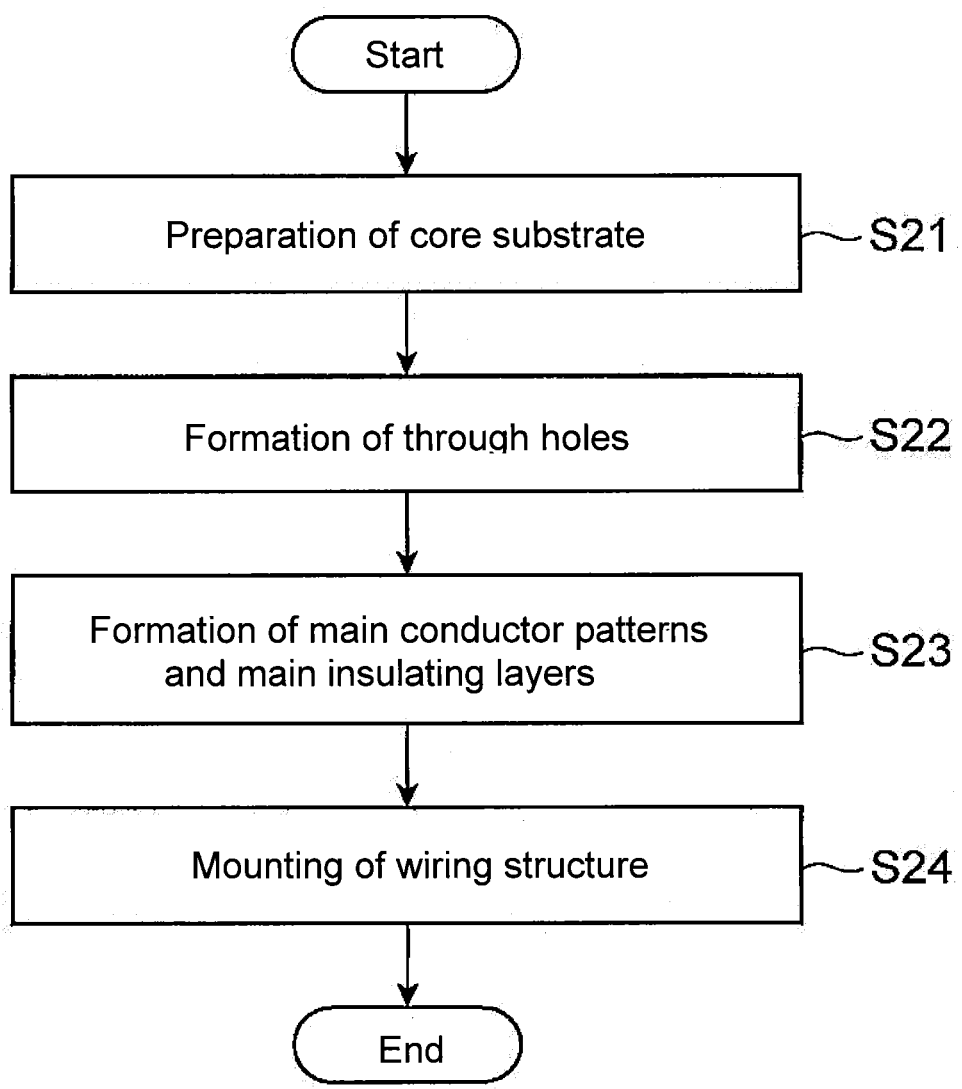

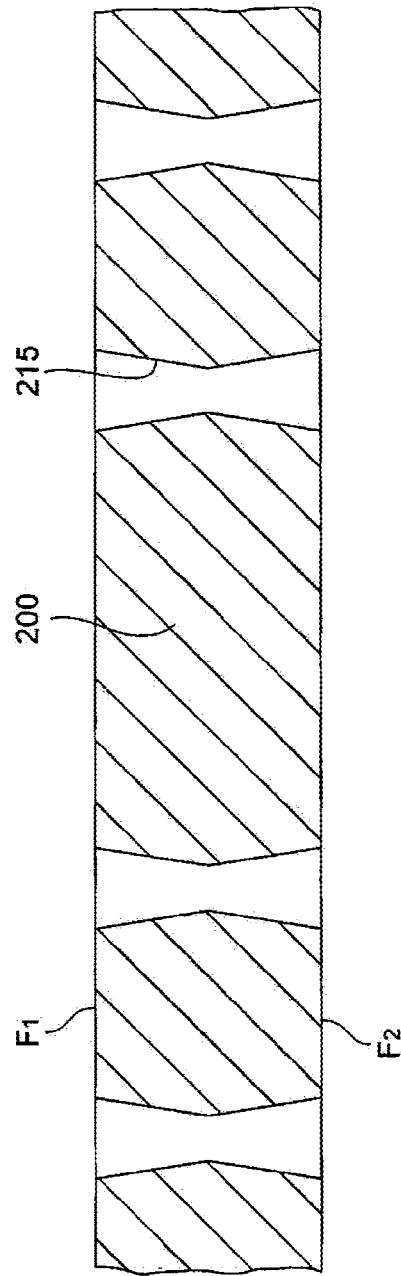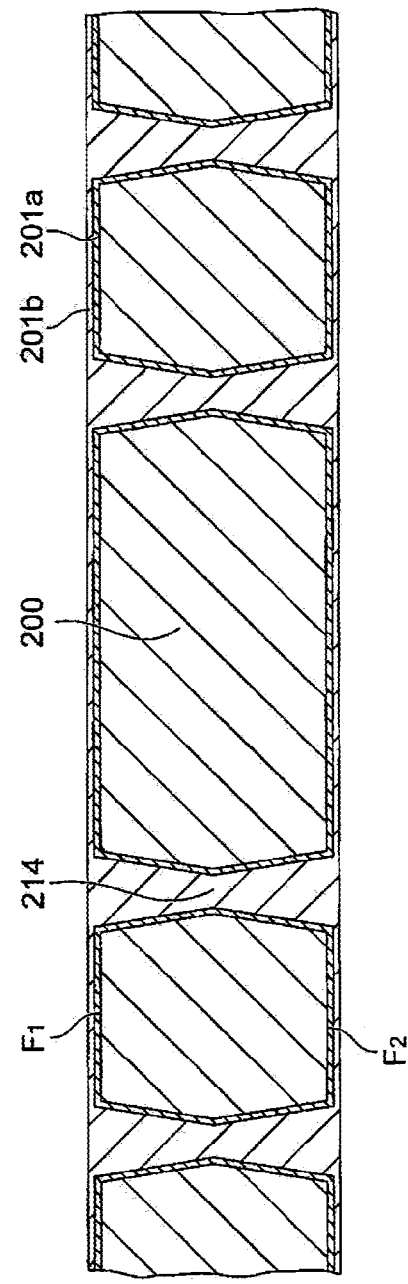

PRINTED WIRING BOARD, METHOD FOR MANUFACTURING THE SAME AND SEMICONDUCTOR DEVICE

CROSS-REFERENCE TO RELATED APPLICATIONS

The present application is based upon and claims the benefit of priority to Japanese Patent Application No. 2014-177019, filed Sep. 1, 2014, the entire contents of which are incorporated herein by reference.

BACKGROUND OF THE INVENTION

Field of the Invention

The present invention relates to a printed wiring board for mounting a semiconductor element, a method for manufacturing the printed wiring board, and a semiconductor device.

Description of Background Art

Japanese Patent Laid-Open Publication No. 2014-49578 describes a printed wiring board which includes a main wiring board and a wiring structure embedded in the main wiring board. The printed wiring board is manufactured by arranging the wiring structure, which is formed separately from the main wiring board, in a recess of the main wiring board, and forming a resin insulating layer of a resin material on the wiring structure to seal the wiring structure inside the main wiring board. The entire contents of this publication are incorporated herein by reference.

SUMMARY OF THE INVENTION

According to one aspect of the present invention, a printed wiring board includes a first resin insulating layer, a first conductor pattern including first mounting pads formed on the first resin insulating layer, and a wiring structure positioned on the first resin insulating layer and including a second resin insulating layer and a second conductor pattern such that the second resin insulating layer and second conductor pattern are positioned adjacent to the first conductor pattern and that the second conductor pattern includes second mounting pads. The second mounting pads are embedded in the second resin insulating layer such that the second mounting pads have mounting surfaces exposed on an exposed surface of the second resin insulating layer, and the first mounting pads have mounting surfaces such that the mounting surfaces of the first and second mounting pads are formed on a same plane.

According to another aspect of the present invention, a method for manufacturing a printed wiring board includes forming a first conductor pattern including first mounting pads on a first resin insulating layer, forming a wiring structure including a second resin insulating layer and a second conductor pattern including second mounting pads such that the second mounting pads have mounting surfaces exposed on an exposed surface of the second resin insulating layer, and mounting the wiring structure onto the first resin insulating layer such that the second resin insulating layer and second conductor pattern are positioned adjacent to the first conductor pattern and that the first mounting pads have mounting surfaces formed on a same plane with the mounting surfaces of the second mounting pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A is a process diagram describing the method for manufacturing the wiring structure;

FIG. 4B is a process diagram describing the method for manufacturing the wiring structure;

FIG. 4E is a process diagram describing the method for manufacturing the wiring structure;

FIG. 4F is a process diagram describing the method for manufacturing the wiring structure;

FIG. 5 is a flowchart illustrating a method for manufacturing a main wiring board and mounting of the wiring structure;

FIG. 6A is a process diagram describing the method for manufacturing the main wiring board;

FIG. 6B is a process diagram describing the method for manufacturing the main wiring board;

DETAILED DESCRIPTION OF THE EMBODIMENTS

Figure 1:
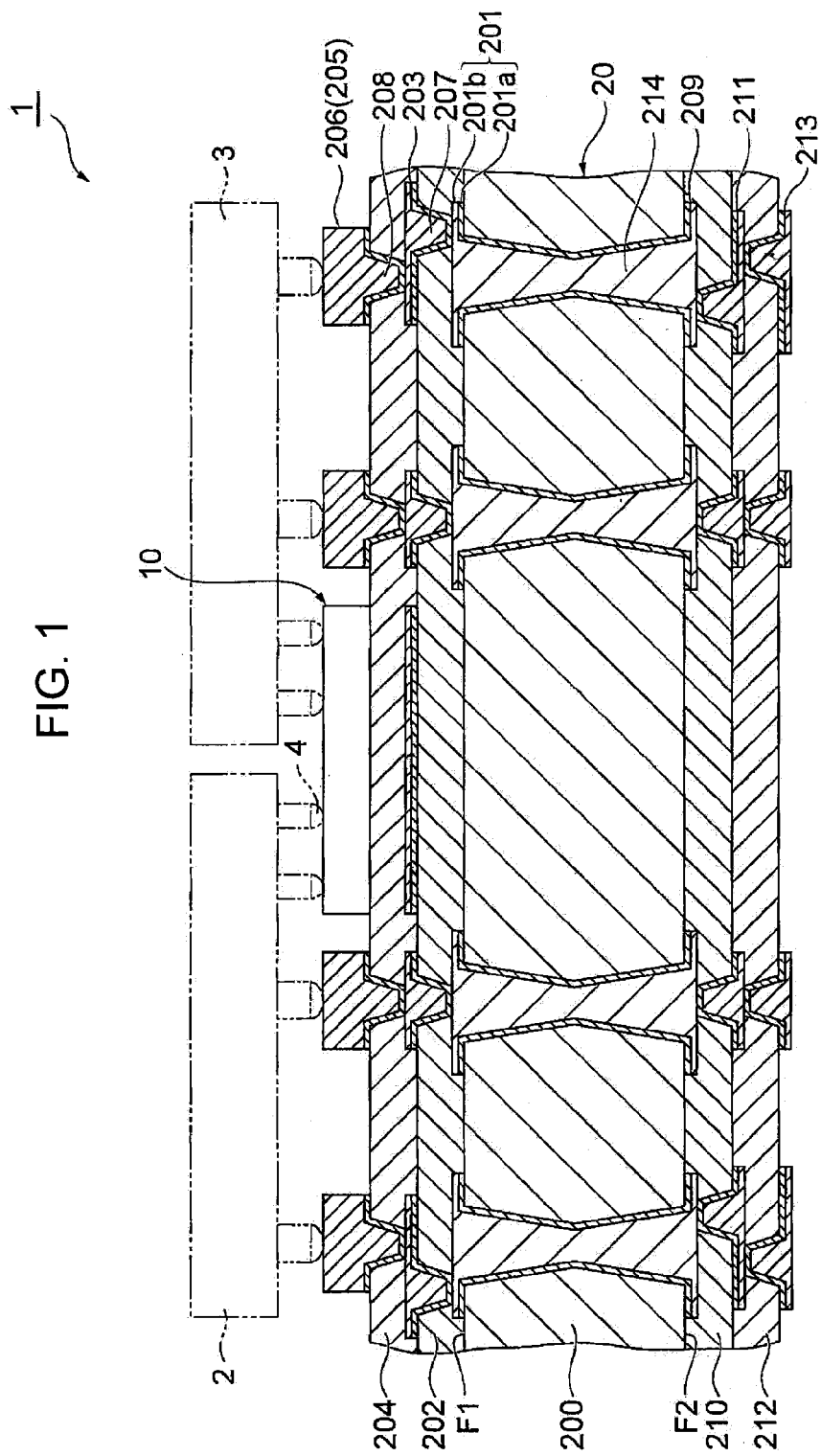
FIG. 1 is a partial cross-sectional view illustrating a printed wiring board according to a first embodiment.

The embodiments will now be described with reference to the accompanying drawings, wherein like reference numerals designate corresponding or identical elements throughout the various drawings.

First Embodiment

As illustrated in FIG. 1, a printed wiring board 1 according to the present embodiment includes a main wiring board 20 and a wiring structure 10 that is mounted on the main wiring board 20. The main wiring board 20 is a build-up multilayer laminated wiring board that is formed by alternately laminating main insulating layers and main conductor patterns on each of a main surface (F1) on one side of a core substrate 200 and a main surface (F2) on the other side of the core substrate 200, the core substrate 200 being formed in the middle of the main wiring board 20. In the present embodiment, the main conductor patterns are patterns that form an electrical circuit. Depending on their array positions, some of the main conductor patterns may each include pads, wirings and the like, and some of the main conductor patterns may each include only mounting pads for mounting a semiconductor element.

First, a structure on the main surface (F1) side of the core substrate 200 is described. A main conductor pattern 201 that includes an electroless plating layer (201a) and an electrolytic plating layer (201b) is formed on the main surface (F1). The main conductor pattern 201 is covered by a main insulating layer 202 that is formed on the main conductor pattern 201. The main insulating layer 202 is formed of, for example, a thermosetting epoxy resin. A main conductor pattern 203 and a main insulating layer 204 that covers the main conductor pattern 203 are further laminated on the main insulating layer 202. The main conductor pattern 203, similar to the main conductor pattern 201, includes an electroless plating layer and an electrolytic plating layer. On the other hand, the main insulating layer 204, similar to the main insulating layer 202, is formed of a thermosetting epoxy resin.

The main insulating layer 204 is positioned as an outermost layer of the printed wiring board 1 and corresponds to a "first resin insulating layer" in the claims. A main conductor pattern 205 is further formed on the main insulating layer 204. The main conductor pattern 205 corresponds to a "first conductor pattern" in the claims and includes an electroless plating layer and an electrolytic plating layer. Further, the main conductor pattern 205 includes multiple first mounting pads 206 for mounting semiconductor elements (2, 3).

Multiple main via conductors 207 and multiple main via conductors 208 are respectively formed in the main insulating layer 202 and the main insulating layer 204. These main via conductors (207, 208) are each formed in a truncated cone shape that is gradually reduced in diameter from the first mounting pad 206 side toward the core substrate 200 side. As illustrated in FIG. 1, these main via conductors (207, 208) are formed to respectively penetrate through the main insulating layers (202, 204). Then, the main conductor pattern 201 and the main conductor pattern 203 are electrically connected via the main via conductors 207; and the main conductor pattern 203 and the first mounting pads 206 are electrically connected via the main via conductors 208.

As illustrated in FIG. 1, some of the main via conductors (207, 208) and through-hole conductors 214 form stacked conductor vias. Specifically, the main via conductors (207, 208) and the through-hole conductors 214 that are adjacent to the wiring structure 10 are stacked along a lamination direction of the main wiring board 20 and form the stacked conductor vias.

Next, a structure on the main surface (F2) side of the core substrate 200 is described. A main conductor pattern 209 is formed on the main surface (F2). The main conductor pattern 209 includes an electroless plating layer and an electrolytic plating layer, and is electrically connected to the main conductor pattern 201 that is formed on the main surface (F1) on the opposite side via the through-hole conductors 214 that are provided in the core substrate 200. The main conductor pattern 209 is covered by a main insulating layer 210 that is formed on the main conductor pattern 209. The main insulating layer 210 is formed of, for example, a thermosetting epoxy resin.

A main conductor pattern 211, a main insulating layer 212 that covers the main conductor pattern 211, and a main conductor pattern 213 that is formed on the main insulating layer 212, are further laminated in this order on the main insulating layer 210. The main conductor patterns (211, 213), similar to the main conductor pattern 209, each include an electroless plating layer and an electrolytic plating layer. On the other hand, the main insulating layer 212, similar to the main insulating layer 210, is formed of a thermosetting epoxy resin.

Figure 2:
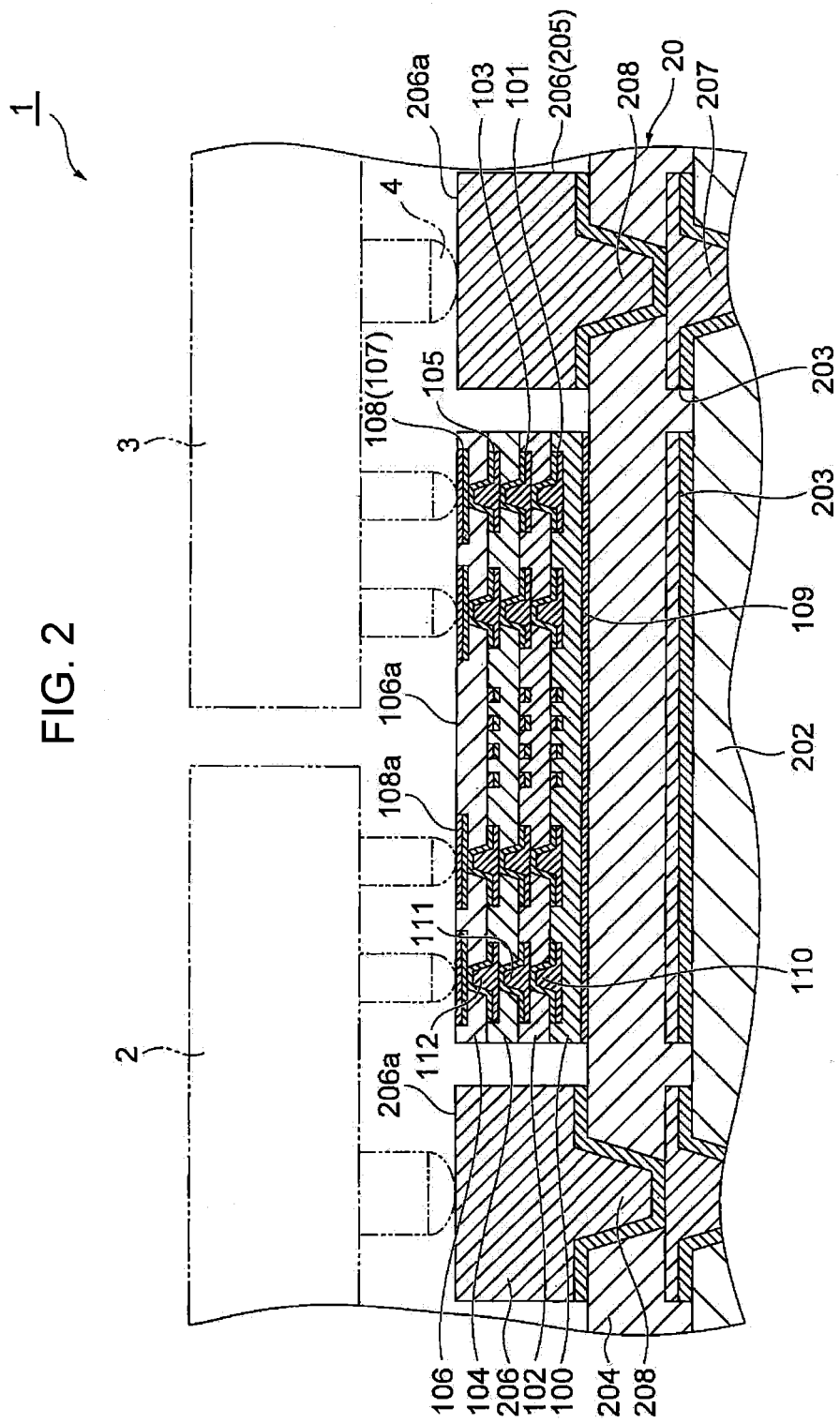
FIG. 2 is an enlarged cross-sectional view illustrating a wiring structure of FIG. 1.

The wiring structure 10 is provided on the main insulating layer 204, and is adjacent to first mounting pads 206 that are formed on the main insulating layer 204. As illustrated in FIG. 2, the wiring structure 10 has a rectangular cross section and is formed in a shape of a cuboid three-dimensionally, and is fixed on the main insulating layer 204 via a bonding layer 109 that is formed at a bottom of the wiring structure 10. A sub insulating layer 100 is formed on the bonding layer 109. A sub conductor pattern 101 is formed in the sub insulating layer 100. In the present embodiment, a sub conductor patterns is a pattern that forms an electrical circuit. Depending on its array position, a sub conductor pattern may include pads, wirings and the like, and may include only mounting pads for mounting a semiconductor element.

A sub insulating layer 102, a sub conductor pattern 103 that is formed in the sub insulating layer 102, a sub insulating layer 104, a sub conductor pattern 105 that is formed in the sub insulating layer 104, and a sub insulating layer 106, are further laminated in this order on the sub insulating layer 100 and the sub conductor pattern 101. The sub insulating layers (100, 102, 104, 106) are each an insulating layer formed of a photosensitive resin. In this way, by using photosensitive resin layers, small-diameter via holes and high-density sub conductor patterns can be easily formed in the sub insulating layers. On the other hand, the sub conductor patterns (101, 103, 105) each include a seed layer and a copper plating layer.

In the wiring structure 10, the sub insulating layer 106 is positioned outermost and is exposed to the outside. The sub insulating layer 106 corresponds to a "second resin insulating layer" in the claims. A sub conductor pattern 107 is formed in the sub insulating layer 106. The sub conductor pattern 107 corresponds to a "second conductor pattern" in the claims, and includes a seed layer and a copper plating layer. Further, the sub conductor pattern 107 includes multiple second mounting pads 108 for mounting the semiconductor elements (2, 3). In the present embodiment, the sub conductor pattern 107 includes only the second mounting pads 108. The wiring structure 10 may have a single-layer configuration that includes only the sub insulating layer 106 and the sub conductor pattern 107 formed in the sub insulating layer 106.

As illustrated in FIG. 2, the second mounting pads 108 are embedded in the sub insulating layer 106 such that upper surfaces (108a) of the second mounting pads 108 are exposed to the outside. The upper surfaces (108a) of the second mounting pads 108 and an upper surface (106a) of the sub insulating layer 106 are positioned on the same plane. In the present embodiment, the second mounting pads 108 are array at intervals of 50 μm or less. Further, the upper surfaces (108*a*) of the second mounting pads 108 are positioned on the same plane as upper surfaces (206*a*) of the first mounting pads 206 that are formed in the main insulating layer 204. That is, in the lamination direction of the sub insulating layers and the sub conductor patterns, the wiring structure 10 has a height that is substantially the same as that of the first mounting pads 206.

Multiple sub via conductors 110, multiple sub via conductors 111 and multiple sub via conductors 112 are respectively formed in the sub insulating layer 102, the sub insulating layer 104 and the sub insulating layer 106. The sub via conductors (110, 111, 112) are each formed in a truncated cone shape that is gradually increased in diameter from the second mounting pad 108 side toward the bonding layer 109 side. The second mounting pads 108 are electrically connected to the sub conductor pattern 105 via the sub via conductors 112 that are formed in the sub insulating layer 106. The sub conductor pattern 105 is electrically connected to the sub conductor pattern 103 via the sub via conductors 111 that are formed in the sub insulating layer 104. Further, the sub conductor pattern 103 is electrically connected to the sub conductor pattern 101 via the sub via conductors 110 that are formed in the sub insulating layer 102.

In the present embodiment, wirings are formed at a higher density in the wiring structure 10 than in the main wiring board 20. That is, an L/S (line-space) of a wiring pattern in the sub conductor patterns (101, 103, 105, 107) is smaller than an L/S of a wiring pattern in the main conductor patterns (201, 203, 205, 209, 211, 213). Preferably, the sub conductor patterns (101, 103, 105, 107) are formed at a high density such that the L/S of a wiring pattern in the sub conductor patterns (101, 103, 105, 107) is (1 μm)/(1 μm)–(5 μm)/(5 μm). Here, L (line) means a width of a wiring in a wiring pattern, and S (space) means an interval between (adjacent) wirings in the wiring pattern.

When, for example, a CPU (Central Processing Unit) (semiconductor element) 2 and a HBM (High Bandwidth Memory) (semiconductor element) 3 are mounted in the printed wiring board 1 that is configured as described above, these semiconductor elements (2, 3) are respectively electrically connected via solder bumps 4 to the first mounting pads 206 and the second mounting pads 108. That is, electrodes of the CPU 2 are electrically connected to the mounting pads on one side among the first mounting pads 206 and the second mounting pads 108 (in FIGS. 1 and 2, the first mounting pads 206 and the second mounting pads 108 that are positioned on the left side). Electrodes of the HBM 3 are electrically connected to the mounting pads on the other side among the first mounting pads 206 and the second mounting pads 108 (in FIGS. 1 and 2, the first mounting pads 206 and the second mounting pads 108 that are positioned on the right side). In this way, the CPU 2 and the HBM 3 are electrically connected via the wiring structure 10.

In the printed wiring board 1 having the above-described configuration, the main insulating layer 204 is positioned as the outermost layer of the printed wiring board 1 and the sub insulating layer 106 is exposed to the outside. Therefore, it is not necessary to seal the wiring structure 10 using a resin insulating layer. Therefore, occurrence of voids and surface undulation due to sealing of the wiring structure 10 can be prevented, a mounting failure due to voids and surface undulation when the semiconductor elements (2, 3) are mounted can be suppressed, and the printed wiring board 1 having high reliability can be obtained. Further, the upper surfaces (206*a*) of the first mounting pads 206 and the upper surfaces (108*a*) of the second mounting pads 108 are formed on the same plane. Therefore, when the semiconductor elements (2, 3) are mounted on these mounting pads, the solder bumps 4 have the same heights. Therefore, mounting of the semiconductor elements (2, 3) can be easily performed and yield can be improved.

Further, the upper surfaces (108*a*) of the second mounting pads 108 and the upper surface (106*a*) of the sub insulating layer 106 are positioned on the same plane. Therefore, peeling of the second mounting pads 108 can be prevented, and occurrence of solder bridging can be prevented using a self-alignment effect when a semiconductor element is mounted. Therefore, even when an array interval of the second mounting pads 108 becomes narrow (for example, 50 μm or less), occurrence of solder bridging can be reliably prevented. As a result, the reliability of the printed wiring board 1 can be further improved.

The printed wiring board 1 according to an embodiment of the present invention is not limited to the above-described embodiment. For example, as needed, the upper surfaces (206*a*) of the first mounting pads 206 and the upper surfaces (108*a*) of the second mounting pads 108 may be subjected to a roughening treatment. As a method of the roughening treatment, for example, etching can be used. In this way, by performing the roughening treatment, adhesion between the mounting pads (108, 206) and the solder bumps can be improved. Therefore, occurrence of a mounting failure when the semiconductor elements (2, 3) are mounted can be further prevented. Further, a surface treatment film may be formed on the upper surfaces (206*a*) of the first mounting pads 206 and the upper surfaces (108*a*) of the second mounting pads 108. As the surface treatment film, an electroless Ni/Pd/Au film, an electroless Ni/Au film, an OSP (Organic Solderability Preservative) film or the like can be used.

In the following, a method for manufacturing the printed wiring board 1 is described. The method for manufacturing the printed wiring board 1 according to the present embodiment includes a method for manufacturing the wiring structure 10 (a process for manufacturing the wiring structure), a method for manufacturing the main wiring board 20 (a process for manufacturing the main wiring board), and a method for mounting the wiring structure 10 on the main wiring board 20 to manufacture the printed wiring board 1 (a process for mounting the wiring structure on the first resin insulating layer). First, with reference to FIG. 3-4L, the method for manufacturing the wiring structure 10 is described.

Method for Manufacturing Wiring Structure

Figure 3:
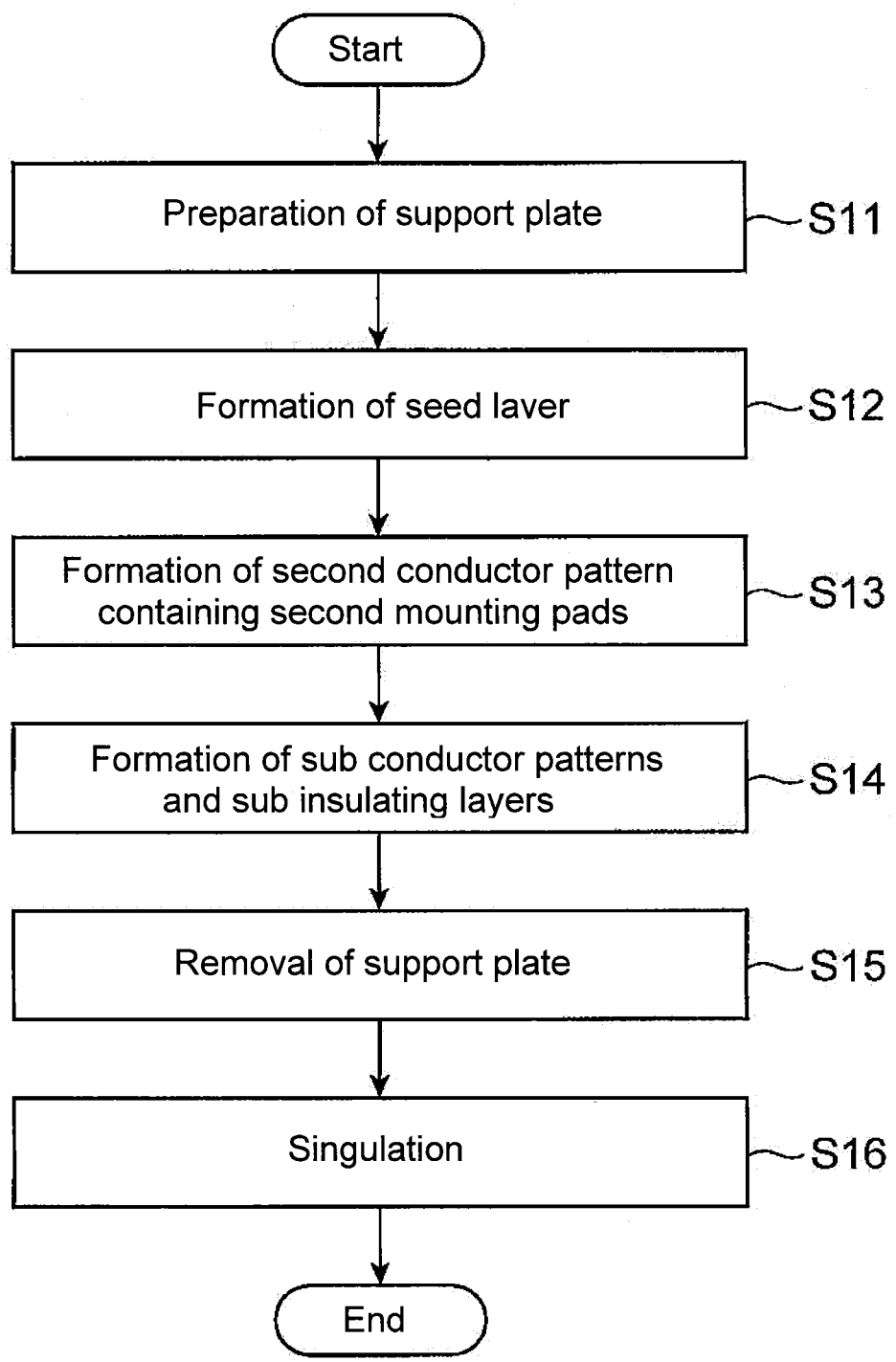
FIG. 3 is a flowchart illustrating a method for manufacturing the wiring structure.

First, at a process (S11) illustrated in FIG. 3, a support plate 115 is prepared (see FIG. 4A). The support plate 115, for example, is a glass plate having a flat surface and a low thermal expansion coefficient. However, the support plate 115 is not limited to this. For example, Si, a metal plate, or the like, can also be used. Next, a release layer 116 is formed on the support plate 115. The release layer 116, for example, has a thickness of 4 μm.

At a process (S12) illustrated in FIG. 3, a seed layer 117 is formed on the release layer 116 (see FIG. 4B). The seed layer 117, for example, is formed using a sputtering method. As a material of the seed layer 117, for example, titanium, titanium nitride, chromium, copper, or the like, can be used.

At a process (S13) illustrated in FIG. 3, the second conductor pattern (sub conductor pattern) 107 that includes the second mounting pads 108 is formed. First, a predetermined resist pattern 118 is formed on the seed layer 117. Specifically, a photosensitive resist layer is applied on the seed layer 117. Thereafter, by performing exposure processing and development processing, the predetermined resist pattern 118 is formed (see FIG. 4C).

A copper plating layer 119 is formed on the seed layer 117 where the resist pattern 118 is not formed. Here, the copper plating layer 119 may be a layer that is formed by laminating an electroless plating layer or by laminating an electrolytic plating layer or by laminating an electroless plating layer and an electrolytic plating layer. Next, the predetermined resist pattern 118 that is formed on the seed layer 117 is peeled off. Next, a portion of the seed layer 117 that is exposed to the outside by the peeling of the resist pattern 118 is etched. The seed layer 117 and the copper plating layer 119 that remain on the release layer 116 form the second mounting pads 108 at predetermined positions for mounting the semiconductor elements (2, 3) (see FIG. 4D).

In the present embodiment, it is preferable that the second mounting pads 108 that are formed from the seed layer 117 and the copper plating layer 119 have a thickness of 5 μm or more. This is for suppressing influence on the second mounting pads 108 due to laser irradiation when the release layer 116 is peeled off by laser irradiation (to be described later).

At a process (S14) illustrated in FIG. 3, the sub conductor patterns and the sub insulating layers are formed. Specifically, first, the sub insulating layer 106 is formed on the second mounting pads 108 and the release layer 116 in a manner covering the second mounting pads 108 and the release layer 116. The sub insulating layer 106 is formed by applying an insulating material made of a photosensitive polyimide resin and by heating.

Via holes 120 are formed at predetermined positions by performing exposure processing of the sub insulating layer 106 using a mask that has openings at the predetermined positions and by further performing development processing. Next, a seed layer 121 is formed on the sub insulating layer 106 and on an inner wall surface and a bottom surface of each of the via holes 120 using a sputtering method (see FIG. 4E).

A predetermined resist pattern 122 is formed on the seed layer 121 using the same method as the above-described resist pattern 118 (see FIG. 4F). Next, a copper plating layer 123 is formed on the seed layer 121 where the resist pattern 122 is not formed, and thereafter, the resist pattern 122 is peeled off. Further, a portion of the seed layer 121 that is exposed to the outside by the peeling of the resist pattern 122 is etched. As a result, the seed layer 121 and the copper plating layer 123 that remain on the sub insulating layer 106 form the sub conductor pattern 105. Then, by the formation of the copper plating layer 123, the via holes 120 are filled with copper. The copper filled in the via holes 120 form the sub via conductors 112 (see FIG. 4G).

Figure 4C:
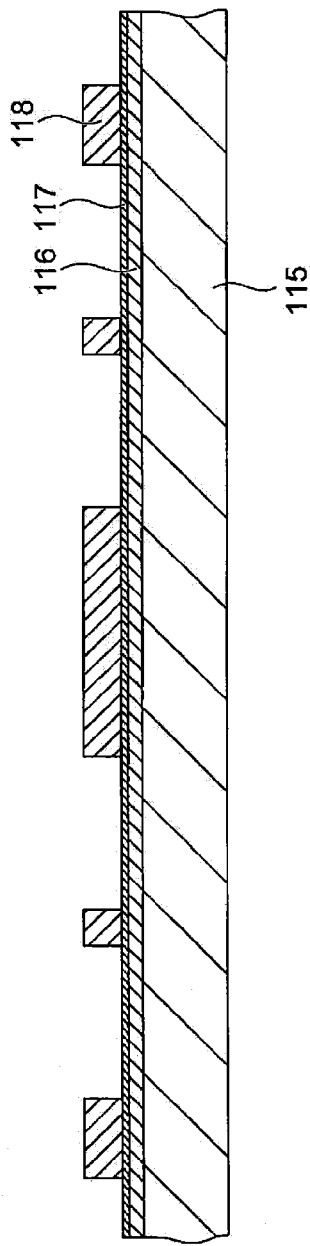
FIG. 4C is a process diagram describing the method for manufacturing the wiring structure.
Figure 4D:
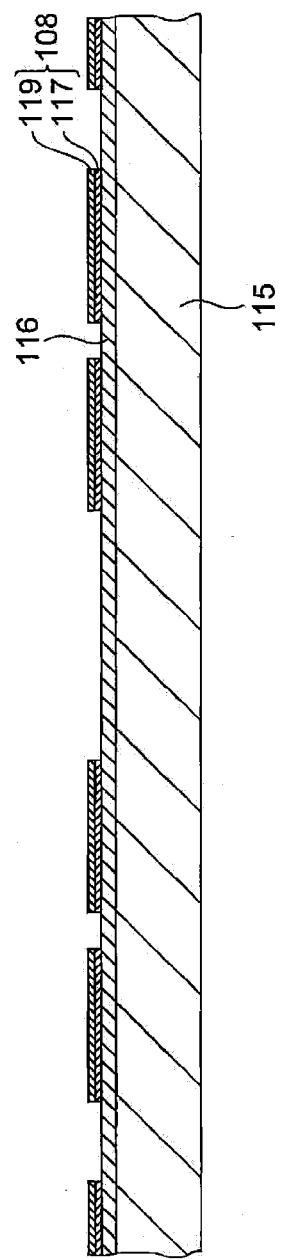
FIG. 4D is a process diagram describing the method for manufacturing the wiring structure.
Figure 4G:
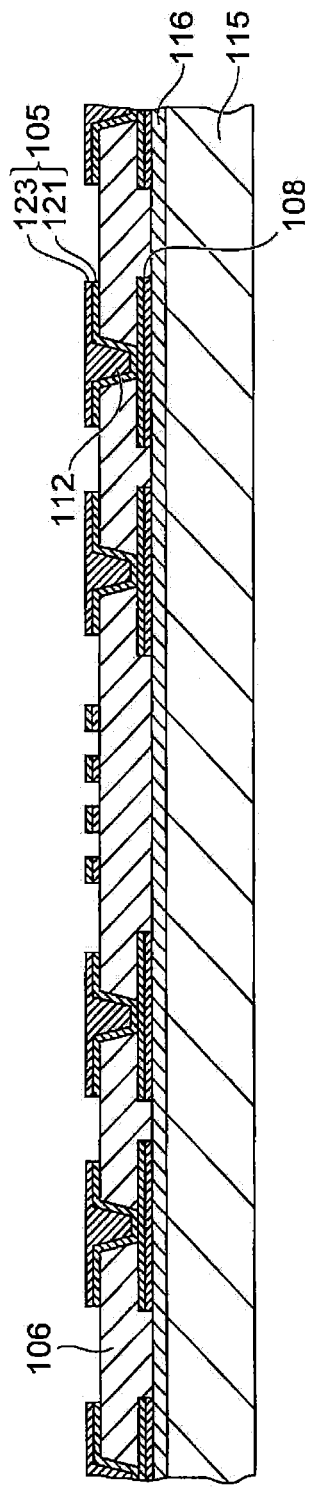
FIG. 4G is a process diagram describing the method for manufacturing the wiring structure.
Figure 4H:
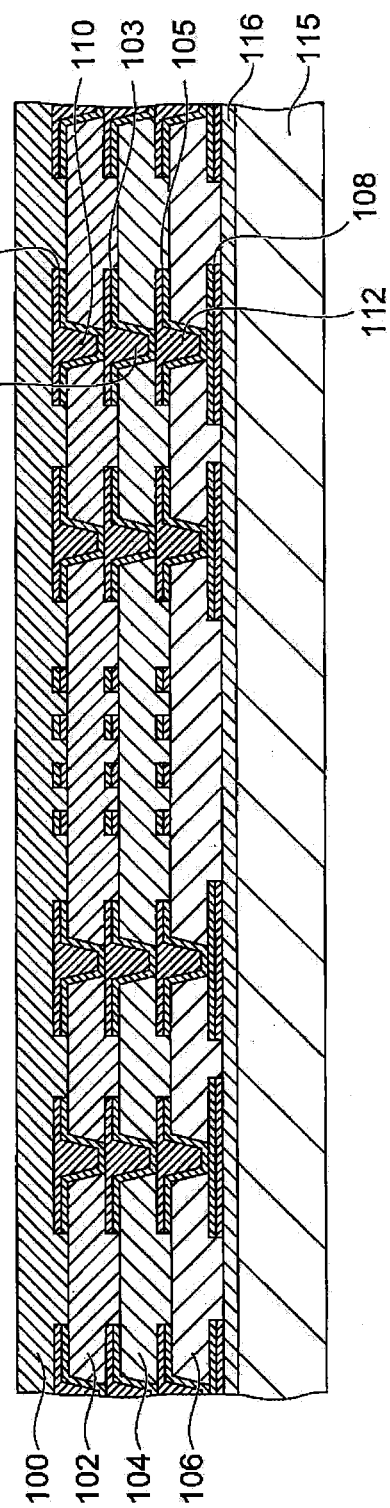
FIG. 4H is a process diagram describing the method for manufacturing the wiring structure.
Figure 4I:
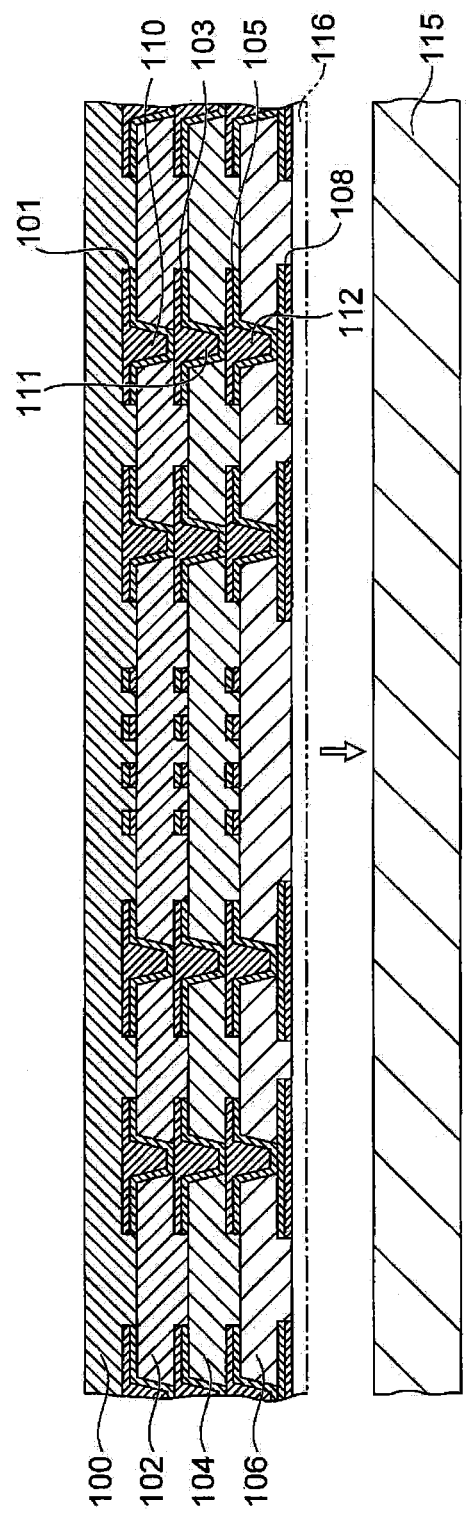
FIG. 4I is a process diagram describing the method for manufacturing the wiring structure.
Figure 4J:
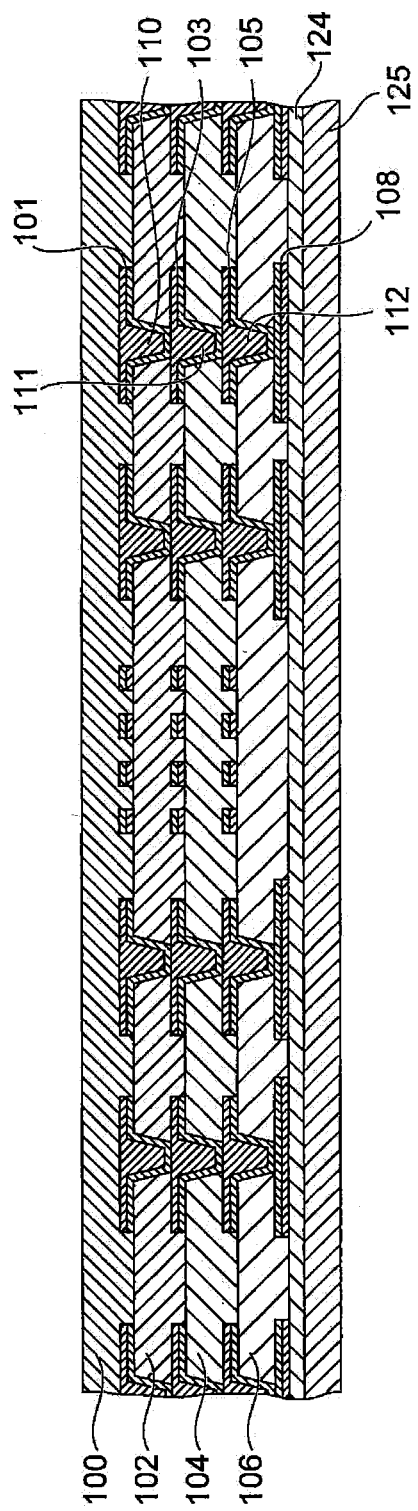
FIG. 4J is a process diagram describing the method for manufacturing the wiring structure.
Figure 4K:
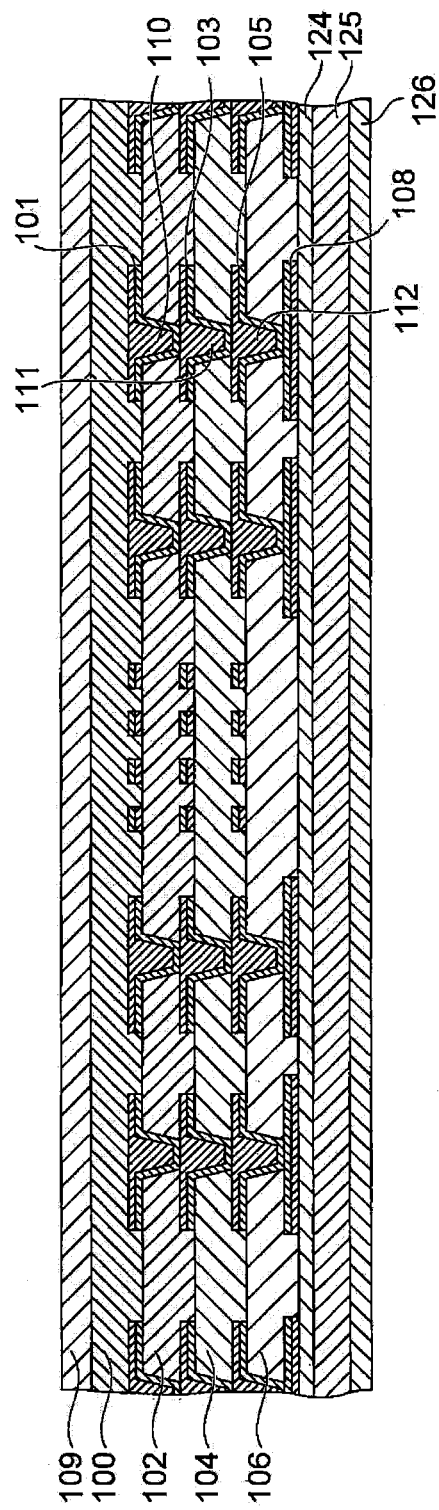
FIG. 4K is a process diagram describing the method for manufacturing the wiring structure.
Figure 4L:
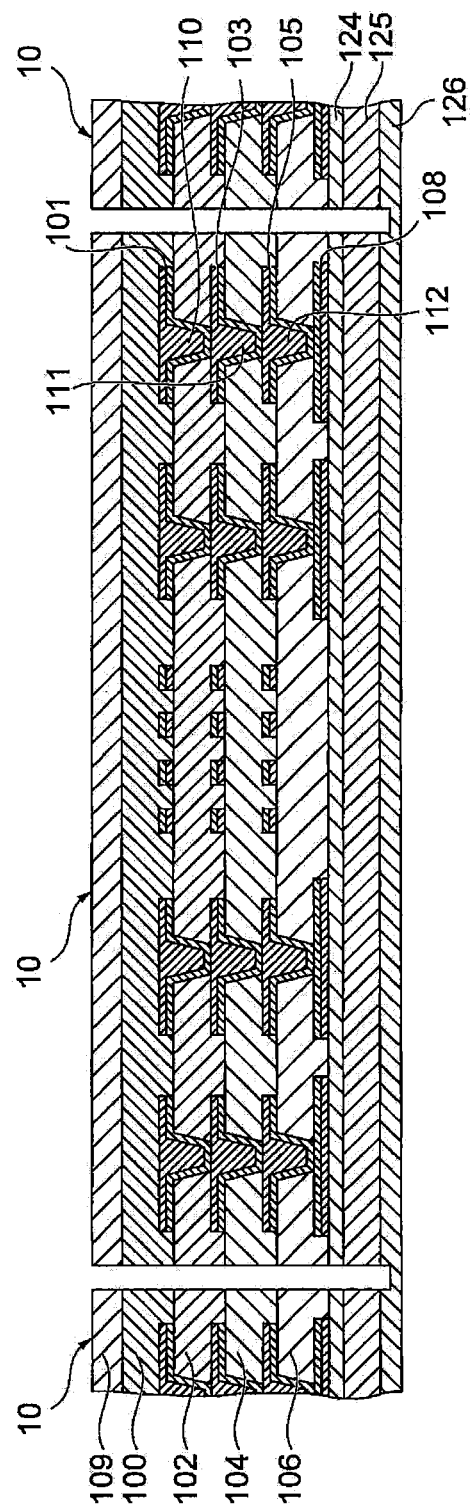
FIG. 4L is a process diagram describing the method for manufacturing the wiring structure.

By repeating the above-described processes, the sub insulating layer 104, the sub conductor pattern 103, the sub via conductors 111, the sub insulating layer 102, the sub conductor pattern 101, the sub via conductors 110, and the sub insulating layer 100 are sequentially formed (see FIG. 4H).

At a process (S15) illustrated in FIG. 3, removal of the support plate 115 is performed. Specifically, by irradiating laser from the support plate 115 side to the release layer 116, the release layer 116 is softened, and the support plate 115 is separated from the wiring structure 10 (see FIG. 4I). In the present embodiment, the support plate 115 is formed using a glass plate. Therefore, laser can be transmitted and irradiated to the release layer 116. Next, the release layer 116 is cleanly removed. As a result, the side where the second mounting pads 108 are formed is exposed to the outside. The removed support plate 115 can be washed and reused.

At a process (S16) illustrated in FIG. 3, singulation of the wiring structure 10 is performed. Specifically, first, a reinforcing plate 125 is pasted via a thermal release film 124 on the side where the second mounting pads 108 are formed (see FIG. 4J). The reinforcing plate 125, for example, is formed of a resin material. Next, the bonding layer 109 is formed on the sub insulating layer 100. The bonding layer 109, for example, is formed by pasting a die attach film on the sub insulating layer 100. Thereafter, a wafer mount tape 126 is pasted on a lower side of the reinforcing plate 125 (see FIG. 4K).

Singulation of the wiring structure 10 is performed by cutting along a predetermined cutting line from the side where the bonding layer 109 is formed. As a result, the wiring structures 10 aligned on the wafer mount tape 126 are obtained (see FIG. 4L).

Method for Manufacturing Main Wiring Board

In the following, with reference to FIG. 5-6G, the method for manufacturing the main wiring board 20 and the method for mounting the wiring structure 10 on the main wiring board 20 to manufacture the printed wiring board 1 are described. The main wiring board 20 is formed by sequentially laminating layers that have the same functions by the same processes across a central axis of the core substrate 200. Therefore, for FIG. 6C and thereafter, the description is given using only one side (the main surface (F1) side of the core substrate 200).

First, at a process (S21) illustrated in FIG. 5, the core substrate 200 is prepared. The core substrate 200, for example, is a substrate that is formed by impregnating a core material made of a glass fiber cloth with an epoxy resin. Next, a copper foil (not illustrated in the drawings) is formed on both the main surface (F1) and the main surface (F2) of the core substrate 200.

At a process (S22) illustrated in FIG. 5, through holes 215 are formed. Specifically, by alternately irradiating laser from the main surface (F1) side and the main surface (F2) side of the core substrate 200 using $CO_2$ laser, the through holes 215 are formed in the core substrate 200 (see FIG. 6A). After the formation of the through holes 215, it is preferable that the core substrate 200 be immersed in a solution containing permanganic acid of a predetermined concentration and a desmear treatment be performed. By performing the desmear treatment in this way, unwanted conduction (short circuiting) can be suppressed.

At a process (S23) illustrated in FIG. 5, the main conductor patterns and the main insulating layers are formed. Specifically, the core substrate 200 is immersed in an electroless plating solution, and the electroless plating layer (201a) is formed on both the main surfaces (F1, F2) and inner wall surfaces of the through holes 215 of the core substrate 200 on which the copper foil is formed. As a material that forms the electroless plating layer (201a), copper, nickel or the like can be used. Next, using the electroless plating layer (201a) as a seed layer, the electrolytic plating layer (201b) is formed on the electroless plating layer (201a). Then, the through holes 215 are filled with the electrolytic plating material, and the electrolytic plating material filled in the through holes 215 forms the through-hole conductors 214 (see FIG. 6B).

Next, an etching resist of a predetermined pattern is formed on the electrolytic plating layer (201b). Portions of the electroless plating layer (201a), the electrolytic plating layer (201b) and the copper foil that are not covered by the etching resist are removed. Thereafter, the etching resist is removed. As a result, the copper foil, the electroless plating layer (201a) and the electrolytic plating layer (201b) that remain on the core substrate 200 form the main conductor pattern 201 (see FIG. 6C). The main conductor pattern 201 formed on the main surface (F1) and the main conductor pattern 209 formed on the main surface (F2) are electrically connected via the through-hole conductors 214.

Figure 6C:
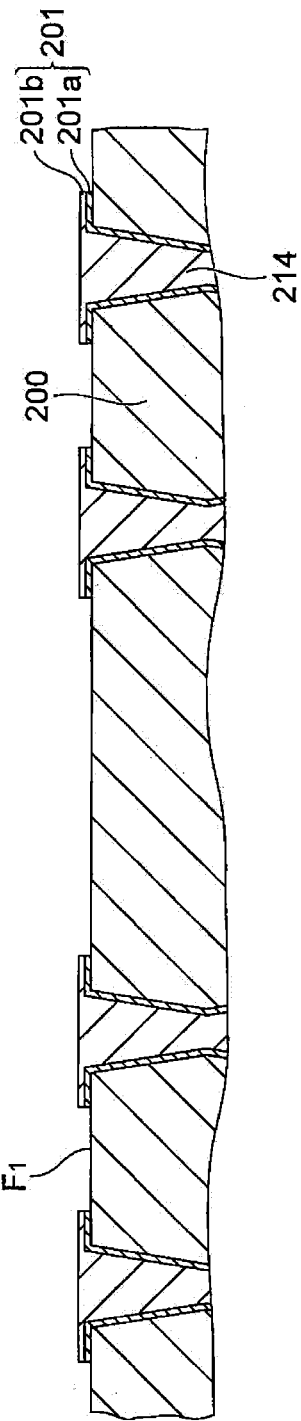
FIG. 6C is a process diagram describing the method for manufacturing the main wiring board.
Figure 6D:
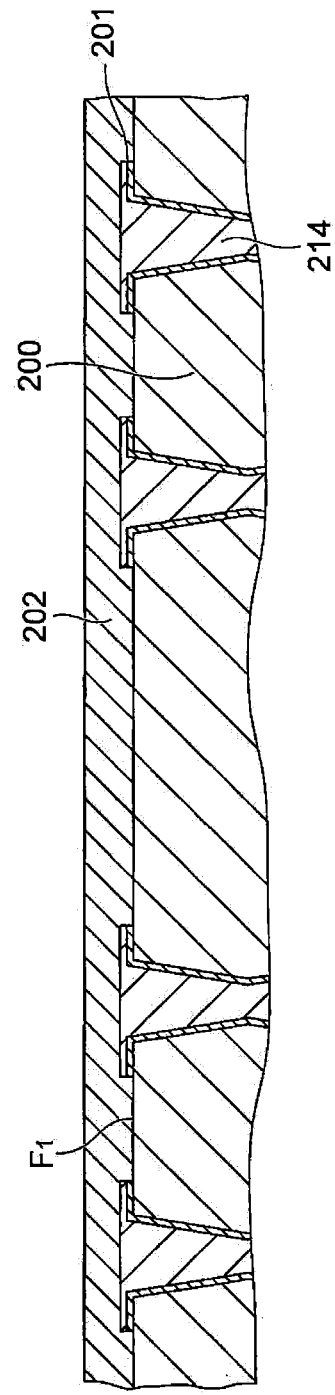
FIG. 6D is a process diagram describing the method for manufacturing the main wiring board.
Figure 6E:
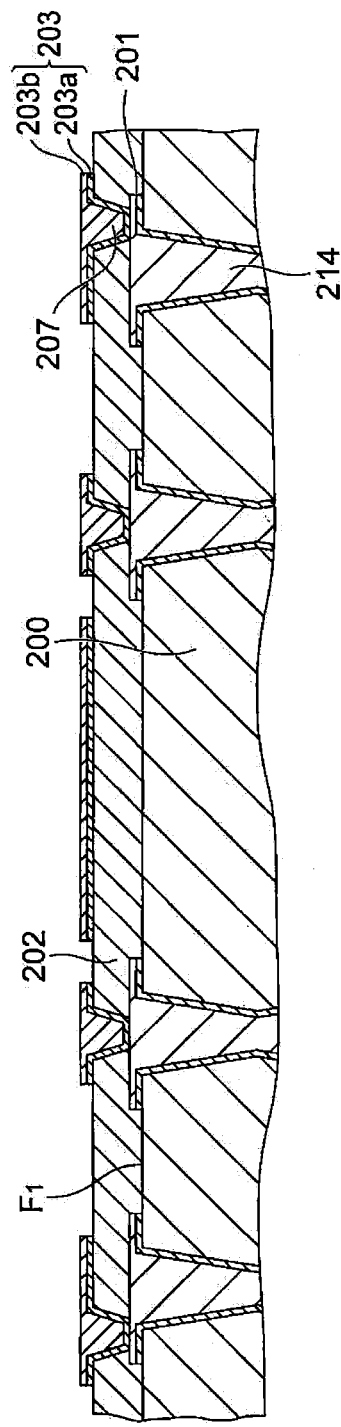
FIG. 6E is a process diagram describing the method for manufacturing the main wiring board.
Figure 6F:
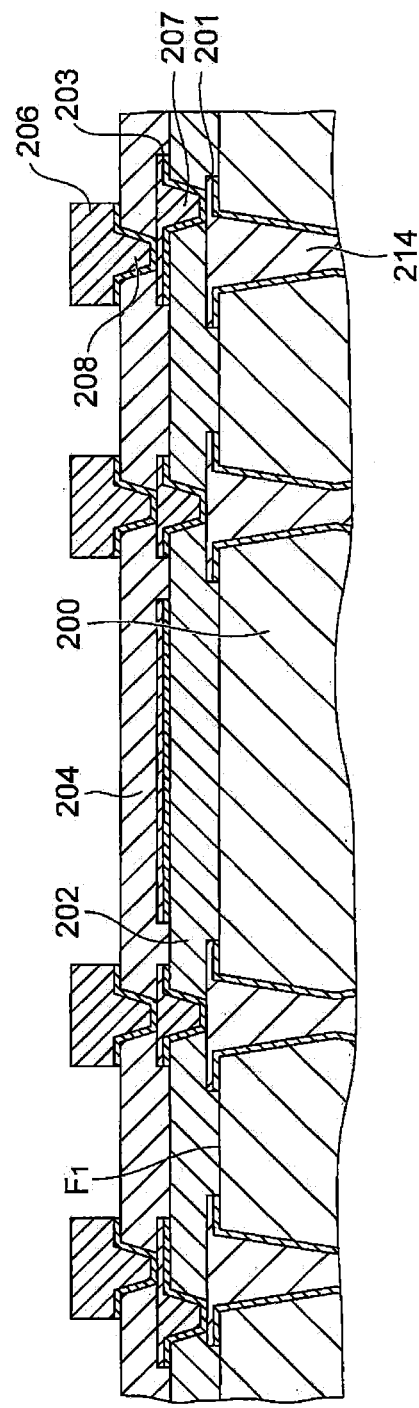
FIG. 6F is a process diagram describing the method for manufacturing the main wiring board.
Figure 6G:
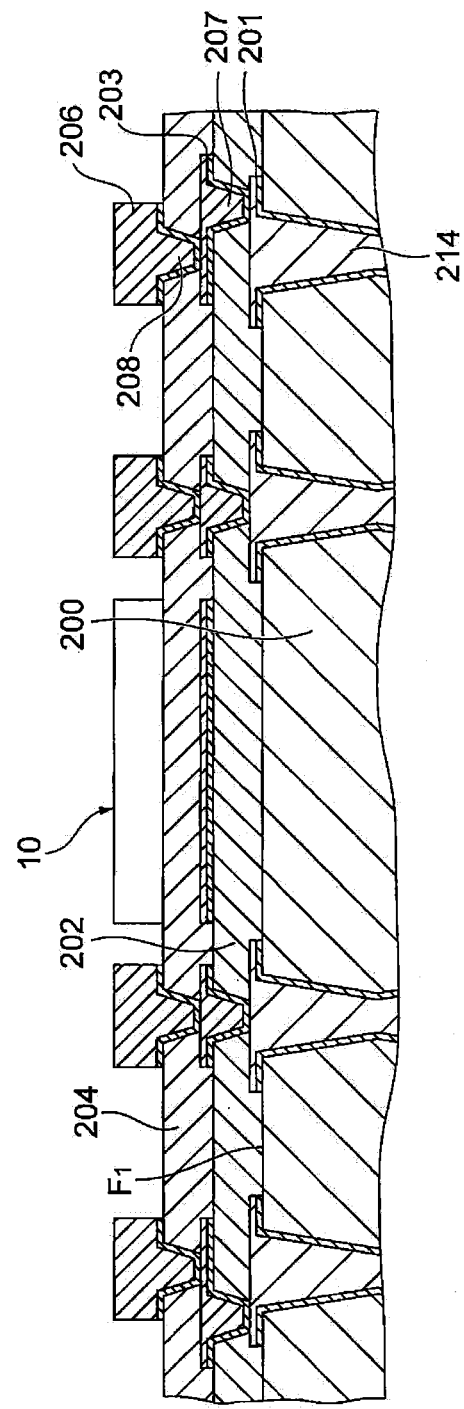
FIG. 6G is a process diagram describing the mounting of the wiring structure.

Next, the main insulating layer 202 is formed by applying an insulating material on the main surface (F1) of the core substrate 200 (see FIG. 6D). As a result, the main conductor pattern 201 is covered by the main insulating layer 202. As the insulating material, for example, a thermosetting epoxy resin can be used. Next, via holes are formed at predetermined positions in the main insulating layer 202 using $CO_2$ laser. Thereafter, an electroless plating layer (203a) is formed on a surface of the main insulating layer 202 and on inner wall surfaces and bottom surfaces of the via holes. Next, a plating resist of a predetermined pattern is formed on the electroless plating layer (203a).

Next, an electrolytic plating layer (203b) is formed on a portion of the electroless plating layer (203a) that is not covered by the plating resist (that is, a portion that is exposed to the outside). As a result, the via holes are filled with the electrolytic plating material, and the electrolytic plating material filled in the via holes forms the main via conductors 207. Next, the plating resist is removed using a solution containing monoethanolamine. Further, a portion of the electroless plating layer (203a) that is exposed to the outside due to the removal of the plating resist is removed by etching. As a result, the electroless plating layer (203a) and the electrolytic plating layer (203b) that remain on the main insulating layer 202 form the main conductor pattern 203 (see FIG. 6E). Next, by repeating the above-described processes, the main insulating layer 204, the main via conductors 208, and the first mounting pads 206 are sequentially formed (see FIG. 6F).

Method for Mounting Wiring Structure on Main Wiring Board to Manufacture Printed Wiring Board At a process (S24) illustrated in FIG. 5, the wiring structure 10 is mounted on the main wiring board 20. Specifically, for example, an adhesive force of the wafer mount tape 126 is weakened using ultraviolet radiation and the singulated wiring structure 10 is picked up from the wafer mount tape 126. Next, the wiring structure 10 is mounted on the main insulating layer 204 of the main wiring board 20 in such a manner that the bonding layer 109 of the wiring structure 10 faces downward.

Next, by applying heat to the thermal release film 124, the thermal release film 124 and the reinforcing plate 125 are peeled off from the wiring structure 10. Thereafter, by applying heat to the bonding layer 109 to cure the bonding layer 109, the wiring structure 10 is fixed on the main wiring board 20 (see FIG. 6G). As a result, the manufacture of the printed wiring board 1 is completed.

Second Embodiment

Figure 7:
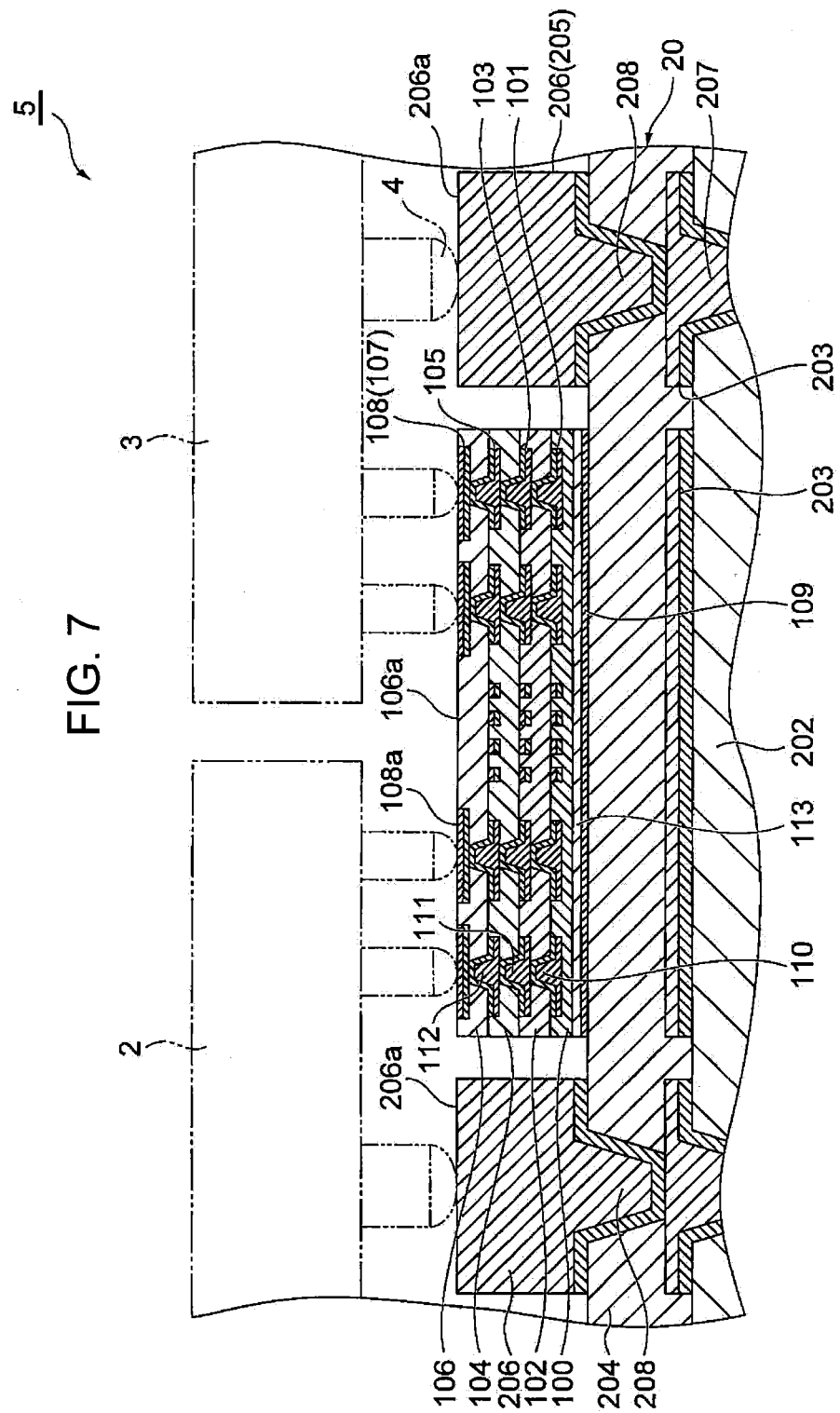
FIG. 7 is a partial cross-sectional view illustrating a wiring structure according to a second embodiment.

In the following, with reference to FIG. 7, a second embodiment of the present invention is described. A printed wiring board 5 according to the present embodiment is different from the above-described first embodiment in that a heat dissipation component 113 is provided. However, other structures and the like are the same as in the first embodiment and redundant description is omitted.

Specifically, the heat dissipation component 113 is provided on the side of the wiring structure 10 where the bonding layer 109 is formed. The heat dissipation component 113 is formed between the bonding layer 109 and the sub insulating layer 100 and, for example, is a metal plating layer formed by copper plating, and preferably has a thickness of 10-80 μm. In addition to above-described copper plating layer, the heat dissipation component 113 may also be formed by a metal plating layer other than a copper plating layer, a metal plate, or a nano-carbon material.

In the printed wiring board 5 according to the present embodiment, the same operation effect as in the above-described first embodiment can be obtained. Further, since the heat dissipation component 113 is provided in the wiring structure 10, heat generated during operation of the semiconductor elements (2, 3) can be efficiently released to surroundings via the heat dissipation component 113, and an effect of suppressing influence due to a thermal stress can be achieved. As a result, reliability of the printed wiring board 5 can be further improved.

Figure 8:
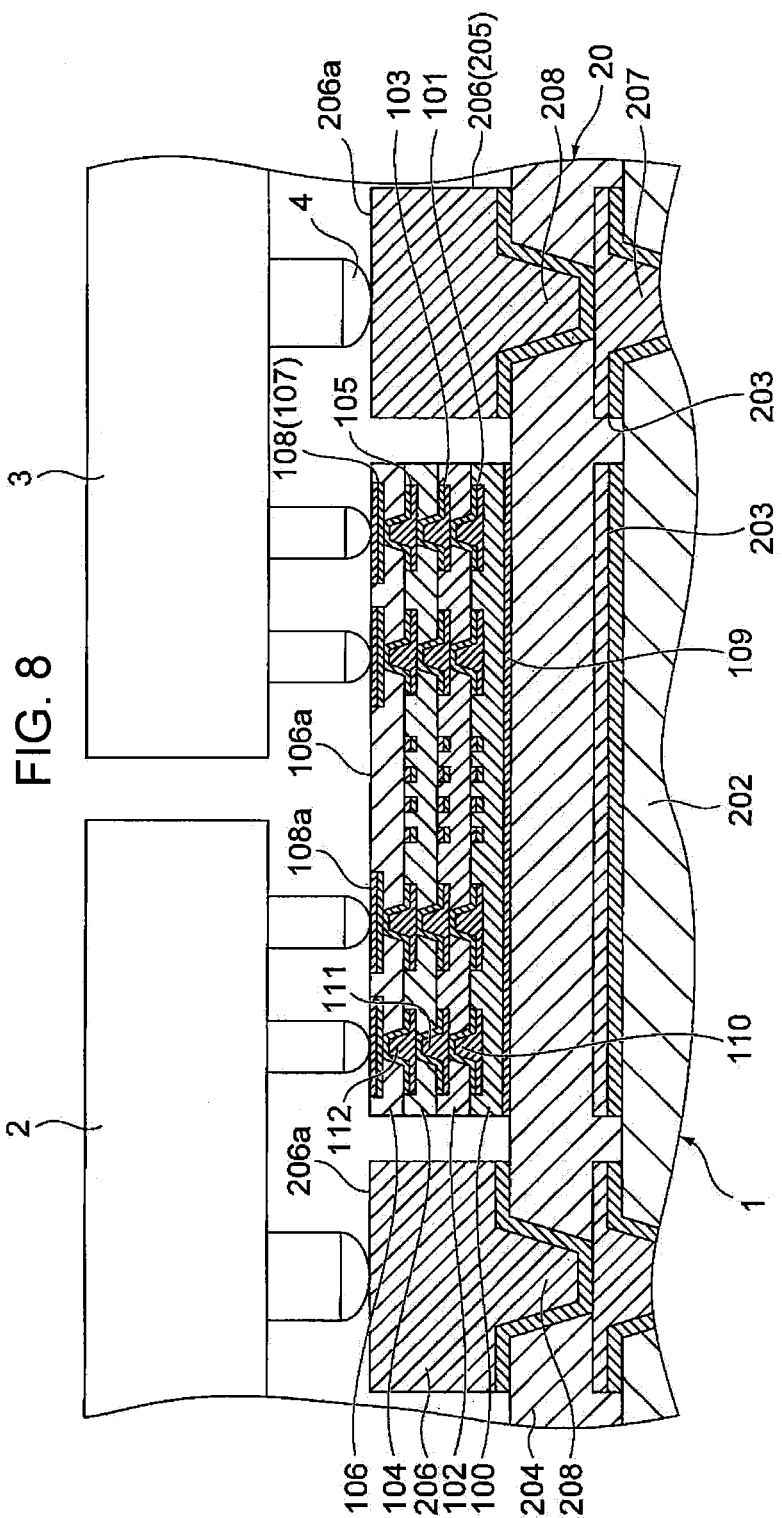
FIG. 8 is a partial cross-sectional view illustrating a semiconductor device.
Figure 9:
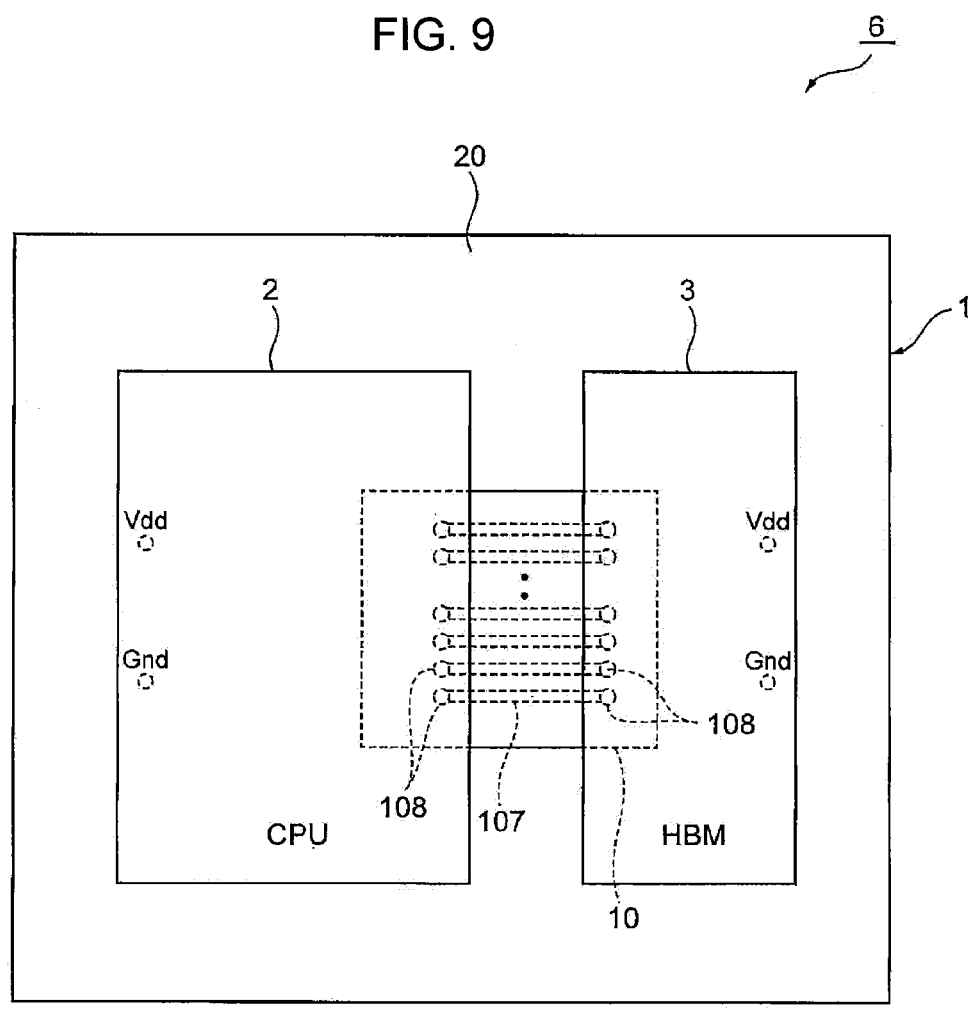
FIG. 9 is a plan view illustrating the semiconductor device.

In the following, with reference to FIGS. 8 and 9, a semiconductor device 6 according to an embodiment of the present invention is described. The semiconductor device 6 includes the printed wiring board 1 that is configured as described above, and the CPU 2 and the HBM 3 that are mounted on the printed wiring board 1. The CPU 2 is electrically connected to mounting pads on one side among the first mounting pads 206 and the second mounting pads 108. The HBM 3 is electrically connected to mounting pads on the other side among the first mounting pads 206 and the second mounting pads 108. As illustrated in FIG. 9, the wiring structure 10 is positioned below the CPU 2 and the HBM 3 in a manner bridging between the CPU 2 and the HBM 3 that are positioned adjacent to each other. The CPU 2 and the HBM 3 are electrically connected by the sub conductor patterns of the wiring structure 10. In the semiconductor device 6 according to the present embodiment, two semiconductor elements (the CPU 2 and the HBM 3) are mounted on the printed wiring board 1. However, without being limited to this, it is also possible that more than two semiconductor elements or electronic components other than semiconductor elements are mounted.

In the semiconductor device 6 that is structured as described above, it is not necessary to seal the wiring structure 10 using a resin insulating layer. Therefore, a mounting failure due to voids and surface undulation when the CPU 2 and the HBM 3 are mounted can be suppressed, and the semiconductor device 6 having high reliability can be obtained. Further, the upper surfaces (206a) of the first mounting pads 206 and the upper surfaces (108a) of the second mounting pads 108 are formed on the same plane. Therefore, when the CPU 2 and the HBM 3 are mounted on these mounting pads, the solder bumps 4 have the same heights. Therefore, mounting of the CPU 2 and the HBM 3 can be easily performed. Further, the upper surfaces (108a) of the second mounting pads 108 and the upper surface (106a) of the sub insulating layer 106 are positioned on the same plane. Therefore, occurrence of solder bridging can be prevented using the self-alignment effect, occurrence of a mounting failure can be suppressed, and the semiconductor device 6 having an even higher reliability can be obtained.

In the above, embodiments of the present invention are described in detail. However, the present invention is not limited to the above-described embodiments. Various design modifications can be performed within the scope without departing from the spirit of the present invention as described in appended claims. For example, In the above-described embodiments, the sub insulating layers of the wiring structure are formed using a photosensitive resin, and the main insulating layers of the main wiring board are formed using a thermosetting epoxy resin. However, it is also possible that the sub insulating layers and the main insulating layers are formed using materials that have the same or comparable thermal expansion coefficients. In this way, by using materials that have the same or comparable thermal expansion coefficients, occurrence of a thermal stress due to a difference in the thermal expansion coefficients of the materials can be prevented, and an effect of reliably suppressing influence due to the thermal stress can be achieved.

Further, in the above-described embodiments, the sub via conductors (110, 111, 112) of the wiring structure 10 are each formed in a shape that is gradually increased in diameter from the second mounting pad 108 side toward the bonding layer 109 side. However, these sub via conductors may also be each formed in a shape that is gradually reduced in diameter from the second mounting pad 108 side toward the bonding layer 109 side. Further, in the above-described embodiments, a case is described where two semiconductor elements (the CPU 2 and the HBM 3) are electrically connected via the wiring structure 10. However, it is also possible that more than two electronic components are electrically connected via the wiring structure 10.

Figure 10:
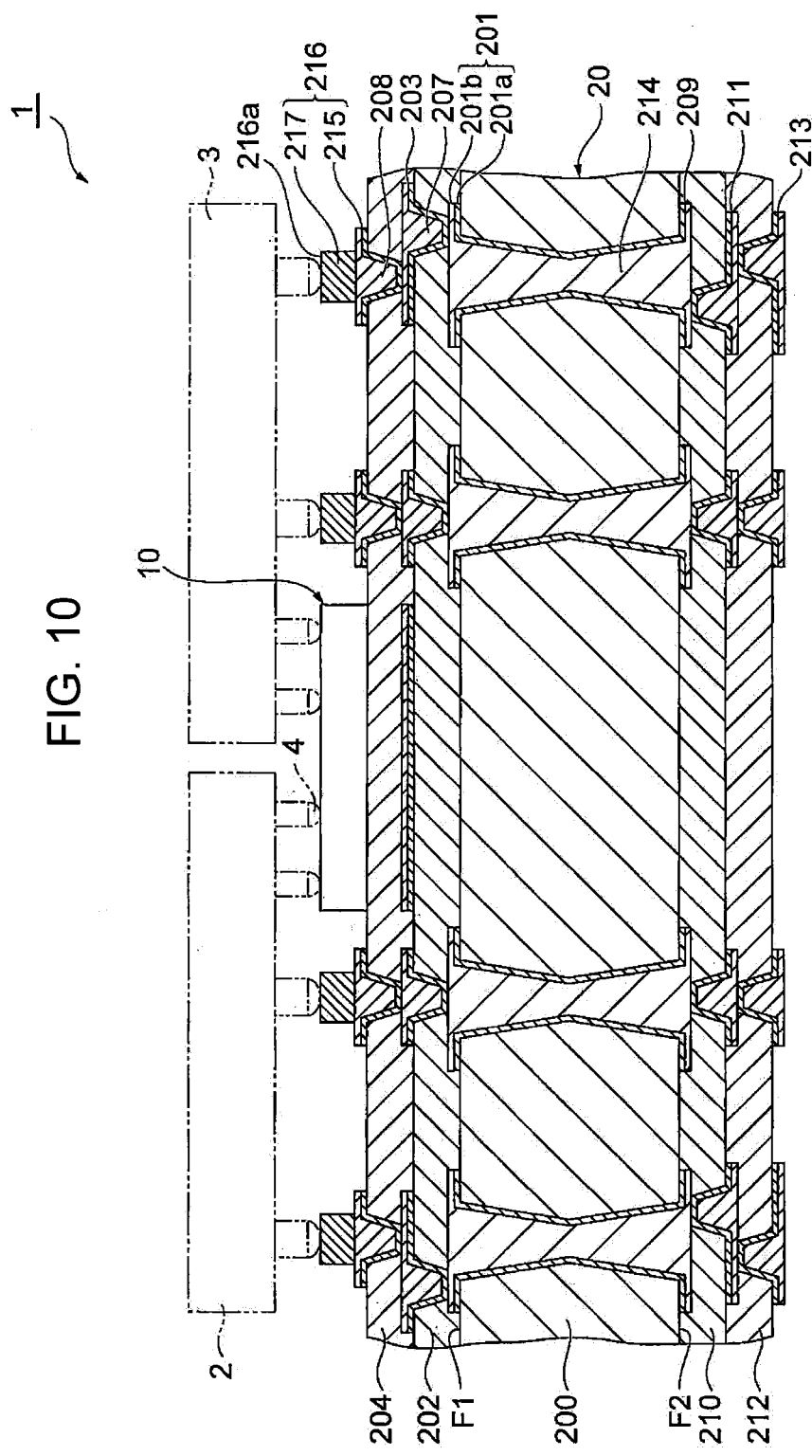
FIG. 10 is a partial cross-sectional view illustrating another structure of a first conductor pattern.

Further, in the above-described first embodiment, the first mounting pads 206 are formed by the electroless plating layer and the electrolytic plating layer such that the upper surfaces (206a) of the first mounting pads 206 and the upper surfaces (108a) of the second mounting pad 108 are positioned on the same plane. However, the method for forming the first mounting pads is not limited to this. For example, as illustrated in FIG. 10, first mounting pads 216 are formed to each include a main conductor pad 215 and a conductor component 217 that is provided on the main conductor pad 215. The main conductor pad 215, similar to the main conductor pattern 203, includes an electroless plating layer and an electrolytic plating layer, and has the same height as the main conductor pattern 203. On the other hand, the conductor component 217 is formed separately from the main conductor pad 215. The conductor component 217, for example, is formed as follows. A plating resist is applied oh the main conductor pad 215. An opening is further formed in the plating resist, and the conductor component 217 is formed in the opening using a Cu electrolytic plating method. Thereafter, the plating resist is removed. Upper surfaces (216a) of the first mounting pads 216 that are formed as described above are positioned on the same plane as the upper surfaces (108a) of the second mounting pads 108.

As a method for allowing the upper surfaces of the first mounting pads and the upper surfaces of the second mounting pads to be positioned on the same plane, in addition to the method in which the thickness of the first mounting pads 206 is increased as illustrated in the above-described first embodiment (see FIGS. 1 and 2) and the method in which the conductor component 217 is provided on the main conductor pad 215 as illustrated in FIG. 10, a method is also possible in which the upper surfaces of those pads are positioned on the same plane by adjusting the heights of the upper surfaces by reducing the number of layers of the wiring structure 10. Therefore, the best method can be appropriately selected by considering ease in manufacturing, conditions of a manufacturing process, restrictions in design and the like.

A printed wiring board may include a main wiring board in which a resin insulating layer and a conductor layer are laminated, and a wiring structure that is embedded in the main wiring board. The printed wiring board may be manufactured by arranging the wiring structure, which is formed separately from the main wiring board, in a recess of the main wiring board, and forming a resin insulating layer of a resin material on the wiring structure to seal the wiring structure inside the main wiring board.

When the wiring structure is sealed using the above-described resin insulating layer, in a case where the formed resin insulating layer has a thin thickness, the resin material cannot sufficiently flow into gaps. Therefore, there is a possibility that voids (air bubbles) are generated, and undulations (unevenness) occur on a surface of the formed resin insulating layer. As a result, a mounting failure is likely to occur when a semiconductor element is mounted, and reliability of the printed wiring board is likely to be affected.

A printed wiring board according to an embodiment of the present invention has high reliability.

A printed wiring board according to an embodiment of the present invention includes: a first resin insulating layer that is positioned as an outermost layer; a first conductor pattern that includes multiple first mounting pads that are formed on the first resin insulating layer; and a wiring structure that is provided on the first resin insulating layer and includes: a second resin insulating layer that is adjacent to the first conductor pattern; and a second conductor pattern that includes multiple second mounting pads. The second resin insulating layer is exposed to outside. The second mounting pads are embedded in the second resin insulating layer such that upper surfaces of the second mounting pads are exposed to the outside. The upper surfaces of the second mounting pads and upper surfaces of the first mounting pads are positioned on the same plane.

According to an embodiment of the present invention, the first resin insulating layer is positioned as the outermost layer, and the second resin insulating layer is exposed to the outside. Therefore, it is not necessary to seal the wiring structure using a resin insulating layer. Therefore, occurrence of voids and surface undulation due to the sealing of the wiring structure can be prevented, a mounting failure due to voids and surface undulation can be suppressed, and a printed wiring board having high reliability can be obtained. Further, the upper surfaces of the first mounting pads and the upper surfaces of the second mounting pads are formed on the same plane. Therefore, when a semiconductor element is mounted on these mounting pads, solder bumps have the same heights. Therefore, mounting of the semiconductor element can be easily performed and yield can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first resin insulating layer;
a first conductor pattern comprising a plurality of first mounting pads formed on the first resin insulating layer; and
a wiring structure positioned on the first resin insulating layer and comprising a second resin insulating layer and a second conductor pattern such that the second resin insulating layer and second conductor pattern are positioned adjacent to the first conductor pattern and that the second conductor pattern includes a plurality of second mounting pads,
wherein the plurality of second mounting pads is embedded in the second resin insulating layer such that the second mounting pads have mounting surfaces exposed on an exposed surface of the second resin insulating layer, and the first mounting pads have mounting surfaces such that the mounting surfaces of the first and second mounting pads are formed on a same plane.

2. The printed wiring board according to claim 1, wherein the plurality of second mounting pads is embedded in the second resin insulating layer such that the mounting surfaces of the second mounting pads and the exposed surface of the second resin insulating layer are formed on the same plane.

3. The printed wiring board according to claim 1, wherein the first conductor pattern and the second conductor pattern have surfaces formed on the same plane.

4. The printed wiring board according to claim 1, wherein the mounting surfaces of the first and second mounting pads are roughened surfaces, respectively.

5. The printed wiring board according to claim 1, wherein each of the mounting surfaces of the first and second mounting pads has a surface treatment film.

6. The printed wiring board according to claim 1, wherein the plurality of second mounting pads is arrayed at intervals of 50 µm or less.

7. The printed wiring board according to claim 1, wherein the wiring structure comprises a heat dissipation component.

8. The printed wiring board according to claim 7, wherein the heat dissipation component of the wiring structure comprises one of a metal plate, a metal plating layer and a nano-carbon material.

9. The printed wiring board according to claim 1, further comprising:
a bonding layer formed between the first resin insulating layer and the wiring structure such that the wiring structure is fixed to the first resin insulating layer.

10. The printed wiring board according to claim 1, wherein the second resin insulating layer has a thermal expansion coefficient which is substantially equal to a thermal expansion coefficient of the first resin insulating layer.

11. The printed wiring board according to claim 1, wherein the second conductor pattern comprises a wiring pattern having a line-space L/S which is smaller than a line-space L/S of a wiring pattern forming the first conductor pattern.

12. The printed wiring board according to claim 11, wherein the wiring pattern of the second conductor pattern has the line-space L/S in a range of from 1 µm/1 µm to 5 µm/5 µm.

13. The printed wiring board according to claim 1, wherein the plurality of second mounting pads is arrayed at intervals of 50 µm or less.

14. The printed wiring board according to claim 2, wherein the wiring structure comprises a heat dissipation component.

15. The printed wiring board according to claim 2, wherein the second resin insulating layer has a thermal expansion coefficient which is substantially equal to a thermal expansion coefficient of the first resin insulating layer.

16. The printed wiring board according to claim 2, wherein the second conductor pattern comprises a wiring pattern having a line-space L/S which is smaller than a line-space L/S of a wiring pattern forming the first conductor pattern.

17. A semiconductor device, comprising:
the printed wiring board of claim 1; and
a plurality of electronic components mounted on the first and second mounting pads of the printed wiring board.

18. The semiconductor device according to claim 17, wherein the printed wiring board is configured to electrically connect the electronic components mounted on the first and second mounting pads of the printed wiring board through the wiring structure.

* * * * *